United States Patent [19]

Inuzuka

[11] Patent Number: 4,936,924

[45] Date of Patent: Jun. 26, 1990

[54] THIN-FILM SOLAR BATTERY AND ITS MANUFACTURING METHOD

[75] Inventor: Takahiko Inuzuka, Amagasaki, Japan

[73] Assignee: Mitsubishi Denki Kabushiki Kaisha, Tokyo, Japan

[21] Appl. No.: 232,687

[22] Filed: Aug. 16, 1988

[30] Foreign Application Priority Data

Aug. 20, 1987 [JP] Japan .............................. 62-207686
Aug. 20, 1987 [JP] Japan .............................. 62-207687

[51] Int. Cl.$^5$ ...................... H01L 27/14; H01L 31/18
[52] U.S. Cl. .................................. 136/249; 437/2; 437/4
[58] Field of Search .................. 437/2, 4, 5; 136/249 MS

[56] References Cited

U.S. PATENT DOCUMENTS

| | | | |
|---|---|---|---|
| 4,042,418 | 8/1977 | Biter | 136/249 |
| 4,428,110 | 1/1984 | Kim | 437/2 |
| 4,443,651 | 4/1984 | Swartz | 136/249 MS |
| 4,517,403 | 5/1985 | Morel et al. | 136/249 MS |
| 4,675,467 | 6/1987 | Van Dine et al. | 136/249 MS |
| 4,754,544 | 7/1988 | Hanak | 437/2 |

OTHER PUBLICATIONS

Japanese Patent Application Laid-Open No. 57-12568, Date of Laid-Open: 1/22/82.

Japanese Patent Application Laid-Open No. 62-119979, Date of Laid-Open: 6/1/87.

Primary Examiner—Aaron Weisstuch
Attorney, Agent, or Firm—Wolf, Greenfield & Sacks

[57] ABSTRACT

This invention relates to a method of manufacturing a thin-film solar battery comprising a plurality of photoelectric power generating elements connected in series. It comprises a process of arranging two or more photoelectric power generating elements each including a junction electrode, back electrode, semiconductive layer, light-permeable electrode, (and current collecting electrode) laminated in this order on an insulative and light-permeable substrate and a process of irradiating a laser beam from the substrate side to the junction electrode of one of adjacent photoelectric power generating elements to melt the junction electrode and to connect the back electrode of one of the adjacent photo-electric power generating elements and the light-permeable electrode (or current collecting electrode) of the other of the adjacent photoelectric power generating elements with the coagulation of the melt. Accordingly, since the back electrode can be patterned prior to the formation of the semiconductive layer and since the series connection of adjacent photoelectric generating elements can be made by laser bonding from the substrate side, the photovoltaic characteristics of the semiconductive layer are never impaired.

32 Claims, 7 Drawing Sheets

THIN-FILM SOLAR BATTERY AND ITS MANUFACTURING METHOD

BACKGOUND OF THE INVENTION

1. Field of the Invention

This invention relates to a method of manufacturing a thin-flim solar battery comprising a plurality of photoelectric power generating elements connected in series.

2. Description of the Prior Art

Generally, a solar battery is composed of a plurality of photoelectric power generating elements connected in series on a substrate to obtain a prescribed photovoltage. Such a composition is formed so far by the method as shown in FIGS. 1-4. (Japanese Patent Appln. Laid Open No. 96778/1984).

FIGS. 1-4 are process diagrams showing the conventional manufacturing process of a thin-film solar battery. As shown in FIG. 1, over nearly the whole surface of an insulative and light-permeable substrate 11 such as glass plate, an indium-tin oxide (ITO) film or an $SnO_2$ film is laminated in this order by vacuum deposition or LP (low pressure) CVD method, to form a light-permeable electrode 12.

Then, as shown in FIG. 2, the light-permeable electrode 12 is provided with grooves 12w at specified intervals with a depth reaching the surface of the insulative and light-permeable substrate 11, by photolithography or a laser processing method and thus is divided into light-permeable electrodes 12a, 12b, 12c, . . . to subsequently form photelectric power generating elements A, B, C, . . . respectively (See FIG. 4). On the surface of these light-permeable electrodes 12a, 12b, 12c, . . . , and the insulative and light-permeable substrate 11 exposed in the bottoms of grooves 12w is laminated a semiconductive layer 13 by a plasma CVD or LPCVD method, with pn junctions or pin junctions.

As shown in FIG. 3, grooves 13w with a depth reaching the surface of the insulative and light-permeable substrate 11 are formed by laser processing through the light-premeable electrodes 12a, 12b, 12c, . . . in the positions near the same side of each electrode in the arrangement direction, to divide the semiconductive layer 13 into semiconductive segments 13a, 13b, 13c, . . . , constituting photoelectric power generating elements A, B, C, . . . , respectively (See FIG. 4). Then, over the surface of these semiconductive layers 13a, 13b, 13c, . . . and the insulative and light-permeable substrate 11 exposed in the bottom of groove 13w, a back electrode 14 of ITO+Ag+Al, or ITO+Ag+Ni, etc. is laminated by sputtering.

Then, as shown in FIG. 4, grooves 14w are formed in a depth reaching from the surface of the back electrode 14 to parts of the semiconductive layers 13a, 13b, 13c, . . . , to divide the back electrode 14 into back electrodes 14a, 14b, 14c, . . . , constituting photoelectric power generating elements A, B, C, . . . , respectively.

Thus, in each of the photoelectric power generating elements A, B, C, . . . , for example, the light-permeable electrode 12a of the photoelectric power generating element A is connected through a part of the back electrode 14 formed in the groove 13w to the back electrode 14b of the adjacent photoelectric generation element B. Similarly, the light-permeable electrodes 12b, 12c, . . . of B, C, . . . are connected to the back electrodes 14c, 14d, . . . , thus forming series connection of a plurality of the photoelectric power generating elements A, B, C, . . . .

In such a solar battery, ligh enters from the insulative and light-permeable substrate 11 side and goes into the semiconductive layers 13a, 13b, 13c, . . . through the light-permeable electrodes 12a, 12b, 12c, . . . , an generated photovoltage is taken out through the light-permeable electrodes 12a, 12b, 12c, . . . and back electrodes 14a, 14b, 14c . . . .

In such a conventional method and device, electrical connection of the light-permeable electrodes 12a, 12b, 12c, . . . with the back electrodes 14a, 14b, 14c, . . . of the photoelectric power generating elements A, B, C, . . . adjacent to each other is attained through a part of the back electrode 14 formed in the grooves 13w. To decrease the resistance of these parts to a high degree without hindrance to practical use, it is necessary to laminate the materials so that no broken section or no void is produced in the grooves 13w. This will require longer time of formation. This inevitably increases the thickness of the back electrodes 14a, 14b, 14c, . . . , leading to poorer productive capacity and higher cost of material and equipment. The metals such as Ag and Al, the back electrode material, having high boiling points, 2200°-2700° C., and high vapor densities, make it difficult to remove the evaporated metals produced when the back electrode 14 formed thick is divided. The evaporated metals dissolve in the semiconductive layers 13a, 13b, 13c, . . . , or stick to the surface of the back electrodes 14a, 14b, 14C, . . . and thus give a very significant influence to the characteristics of the thin-flim solar battery.

SUMMARY OF THE INVENTION

In the method of manufacture according to the invention, a laser beam is irradiated from the junction electrode of one of adjacent photoelectric power generating elements from the insulative and light-permeable substrate side, to the light-permeable electrode (or current collecting electrode) of the other photoelectric power generating element, to melt the junction electrode and to connect the back electrode of the one photoelectric power generating element and the light-permeable electrode (or current collecting electrode) of the other photoelectric power generating element with the coagulation of the melt.

It is a first object of the present invention to provide a method of manufacturing a thin-film solar battery which can pattern the back electrode without giving adverse effects to the photovoltaic characteristics of a semiconductive layer.

A second object of this invention is to provide a method of manufacturing a thin-film solar battery which permits series connection of photoelectric power generating elements adjacent to each other, that is, the connection of the back electrode of one photoelectric power generating element with the light-permeable electrode of the other photoelectric power generating element.

A third object of this invention is to provide a method of manufacturing a thin-film solar battery which permits patterning of the back electrode and series connection of photoelectric power generating elements adjacent to each other with good workability.

A fourth object of this invention is to provide a method of manufacturing a thin-film solar battery which provides series connection of photoelectric power generating elements adjacent to each other.

A fifth object of this invention is to provide a method of manufacturing a thin-film solar battery which permits efficient manufacturing and reduced product costs.

The above and further objects and features of the invention will more fully be apparent from the following detailed description with accompanying drawings.

DESCRIPTION OF THE PREFERRED EMBODIMENTS

The following is the concrete description of the invention in reference to the diagrams showing the process of the operation.

Figure 1:
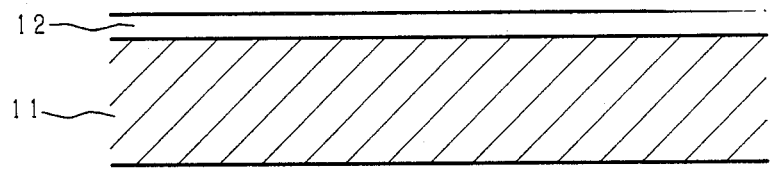
FIG. 1 to FIG. 4 are process diagrams illustrating a conventional method of manufacturing thin-film solar battery.
Figure 2:
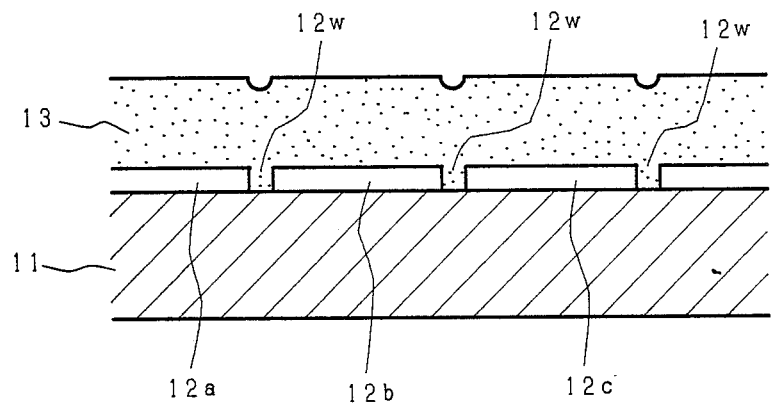
Figure 3:
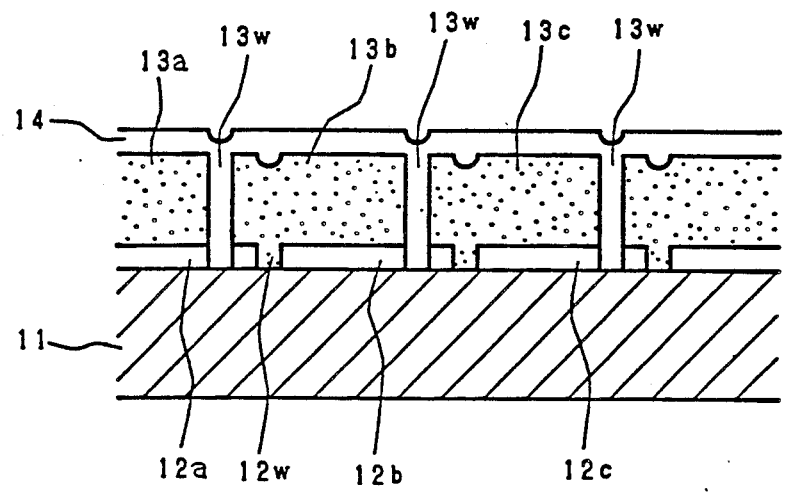
Figure 4:
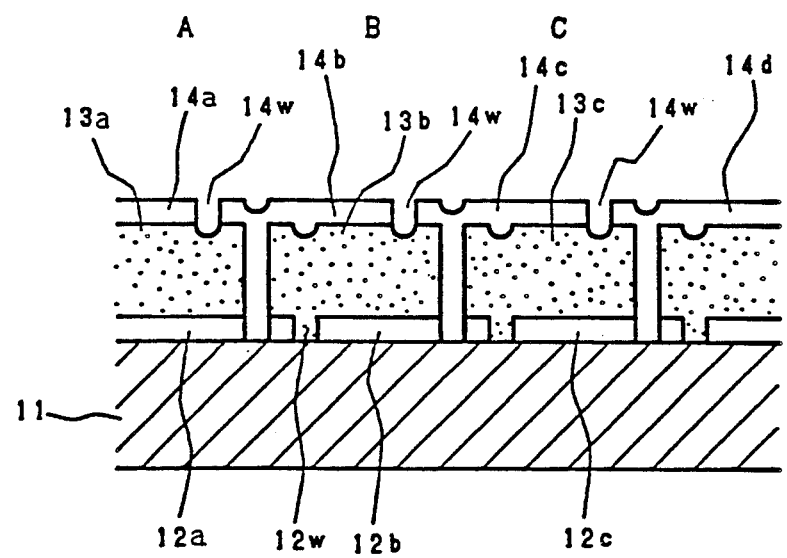
Figure 5:
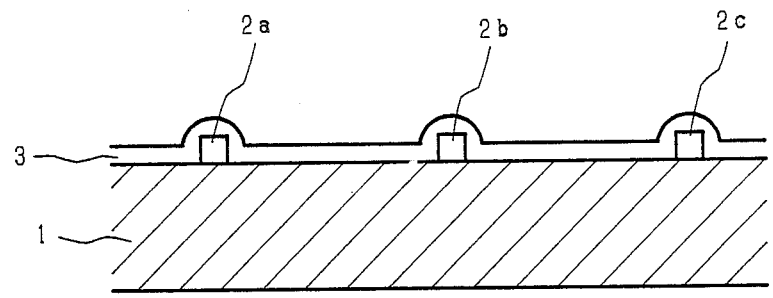
FIG. 5 to FIG. 8 are process diagrams illustrating the first embodiment of the present invention.

FIG. 5 to FIG. 8 are main process diagrams of the 1st embodiment of the method of manufacturing a thin-flim solar battery according to the invention. In this embodiment, each photoelectric power generating element comprises a junction electrode, back electrode, semiconductive layer, and light-permeable electrode laminated in this order. At first, as shown in FIG. 5, an insulative and light-permable substrate 1 (1.1 mm thich, 200 mm long, and 200 mm wide) such as glass plate is washed with an incombustible solvent such as Fronsolve, for degreasing and dust removing, and printed thereon with a pasty high-melting material containing Ag, In, etc. such as high-temperature solder material, by means of such as screen printing in specified intervals (7–15 mm). Then, it is calcined to form junction electrodes 2a, 2b, 2c, . . . (100–200 μm wide, 5–20 μm thick) in every region of photoelectric power generating element A, B, C, . . . formation. Over the surfaces of the insulative and light-permeable substrate 1 including the surface of the junction electrodes 2a, 2b, 2c, . . . , a back electrode 3 of a material such a Ni is laminated to a specified thickness (1000–4000 Å) by means of electroless nickel plating or sputtering.

Figure 6:
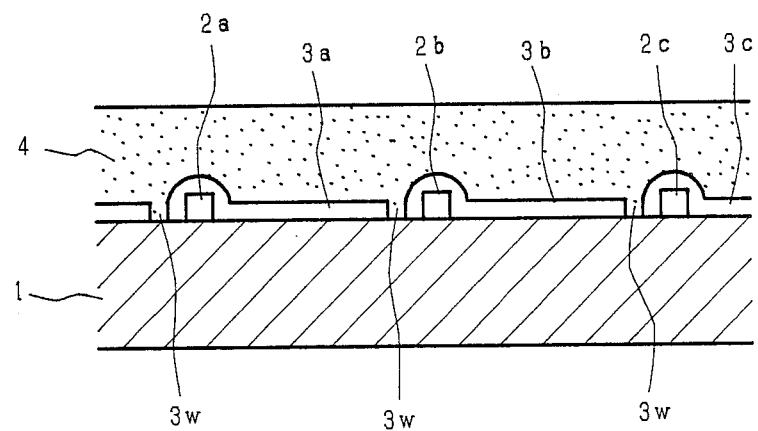

Then, as shown in FIG. 6, a YAG laser beam of a wave length of, for example, 1.06 μm is irradiated from the surface of the (light-permeable) substrate 1 along the junction electrodes 2a, 2b, 2c, . . . at given intervals (50–100 μm) between each junction elctrode 2a, 2b, 2c, . . . to provide grooves 3w (20–150 μm in width) reaching the surface of the insulative and light-permeable substrate 1 to divide the back elecrode 3 at givent intervals (7–15 mm) into back electrodes 3a, 3b, 3c, . . . corresponding to each section constituting the photoelectric power generating elements A, B, C, . . . . Then, extending over the surfaces of the divided back elecrodes 3a, 3b, 3c, . . . and the surface of the insulative and light-permeable substrate 1 exposed in the grooves 3w, semiconductive films of amorphous silicon of n-type, i-type, and p-type cnductivity are laminated in this order to form amorphous silicon semiconductive layer 4 (total film thickness about 6000 Å) having a pin junction, by mens of, for example, multi-chamber separation type plasma CVD.

Figure 7:
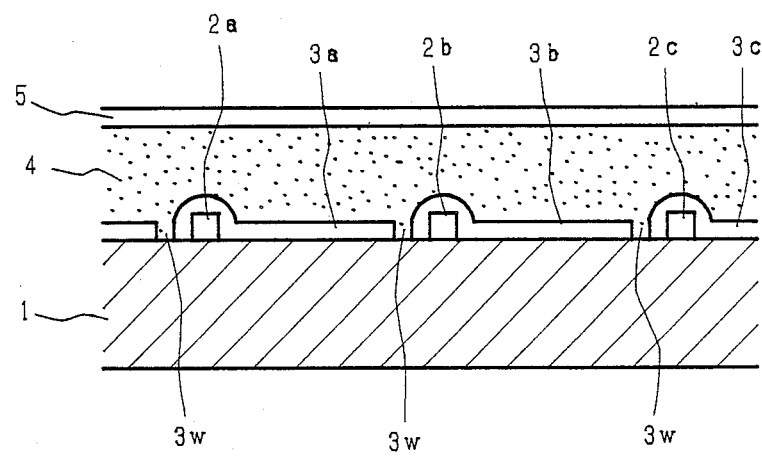

Then, as shown in FIG. 7, over the whole surface of the semiconductive layer 4, an indium-tin oxide film is laminated to a prescribed thickness (about 700 Å) to form a light-permeable electrode 5.

Figure 8:
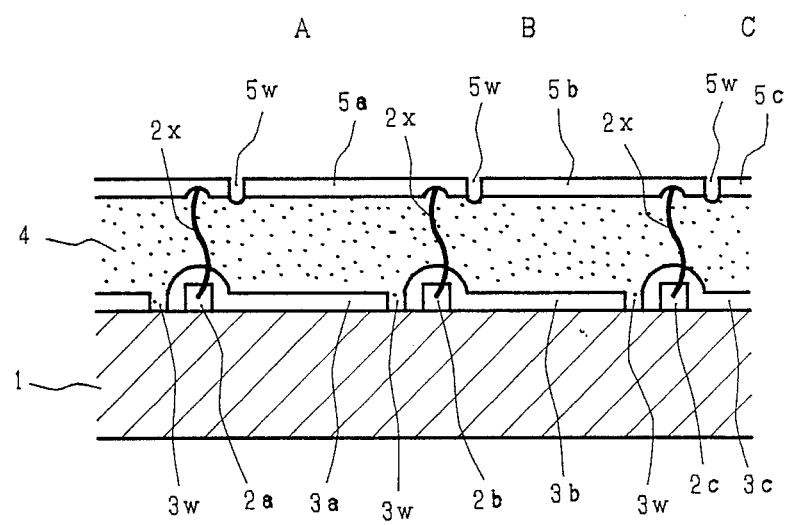

And, as shown in FIG. 8, on the opposite side of the grooves 3w which divide the back electrode 3 with respect to the junction electrodes 2a, 2b, 2c, . . . and in the positions at a given distance (100–200 μm) from the junction electrodes 2a, 2b, 2c, . . . , a KrF excimer laser beam having a wave length of, for example, 0.248 μm is irradiated on the light-permeable electrode 5 to form grooves 5w reaching the semiconductive layer 4 from the light-permeable electrode 5 and divide the light-permeable electrode 5 into light-permeable electrodes 5a, 5b, 5c, . . . constituting the photoelectric power generating elements A, B, C, . . . , respectively. Then, to connect, for example, a junction electrode 2b constituting the photoelectric power generating element B of adjacent photoelectric power generating elements A, B with the light-permeable electrode 5a of the other photoelectric power generating element A, a YAG laser beam of a wave length of 1.06 μm is irradiated on the junction electrode 2b from the insulative and light-permeable substrate side 1. Thus, the junction electrode 2b is melted and parts of the back electrode 3b located between the junction electrode 2band the light-permeable electrode 5a, the semiconductive layer 4, and the light-permeable electrode 5a are fused. The grooves formed by the fusing are filled with the melt of the junction electrode 2b and are solidified. The solidified material 2x electrically connects the back electrode 3b and the light-permeable electrode 5a, leading to so-called laser bonding.

The conversion efficiency of the thin-flim solar battery manufactured in this manner was 6.4%.

Thus, according to the invention, a junction electrode, back electrode, semiconductive layer, and light-permeable electrode are laminated on an insulative and light-permeable substrate, and a laser beam is irradiated thereon from the insulative and light-permeable substrate side to melt the junction electrode of adjacent photo-electric power generating elements. The coagulation of this melt connects the back electrode with the light-permeable electrode of the other side. Therefore, since the back electrode as a metal electrode is patterned prior to the formation of the semiconductive layer, it can be patterned without impairing photovoltaic characteristics of the semiconductive layer in any way. Also, since the series connection of adjacent photoelectric power generation elements (junction of back electrode and light-permeable electrode) is made by the laser bonding form the bottom side of the insulative and light-permeable substrate, it can be attained without impairing the photovoltaic characteristics of the semiconductive layer in any way.

Figure 9:
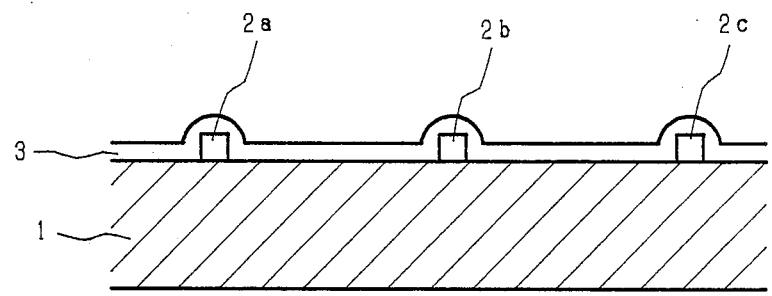
FIG. 9 to FIG. 12 are process diagrams illustrating the second embodiment of the invention.
Figure 10:
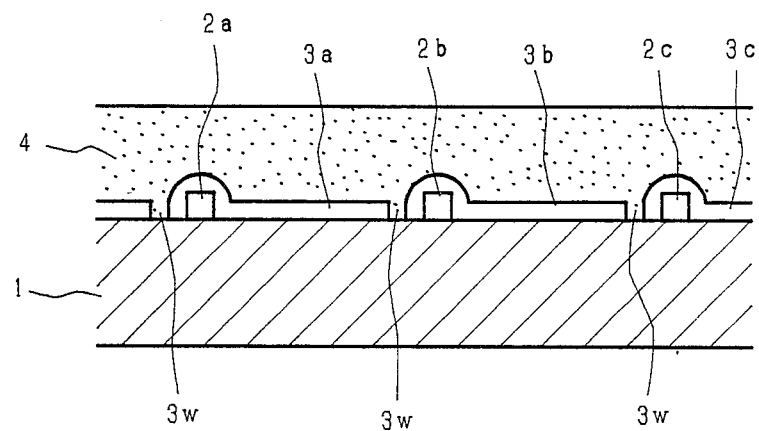

The second embodiment of the invention is next described. In the solar battery of the second embodiment, a junction electrode, back electrode, semiconductive layer light-permeable electrode, and a current collecting electrode are laminated in this order on an insulative and light-permeable substrate to form the composition. FIG. 9 to FIG. 12 are main process diagrams of the second embodiment. The parts in the diagrams having the same reference numbers as in FIGS. 5–8, represent the same or corresponding parts. FIG. 9 shows the conditions after the back electrode 3 has been formed, and FIG. 10 shows the conditions after the semiconductive layer 4 has been formed. The process up to this is the same as that of the above described the 1st embodiment. Thus, its description is omitted. However, in the 2 nd embodiment, the lateral width of the insulative and light-permeable substrate 1 is 300 mm, the interval between the junction electrodes 2a, 2b, 2c, ... is 25 mm, each junction electrode 2a, 2b, 2c, ... has a width of 0.3-1 mm the interval between the back electrodes 3a, 3b, 3c, ... is 25 mm, each of the back electrodes having a thickness of 3000-10000 Å and the total film thickness of the semiconductive layer 4 is 5000 Å. Other values not described here are the same as in the first embodiment.

Figure 11:
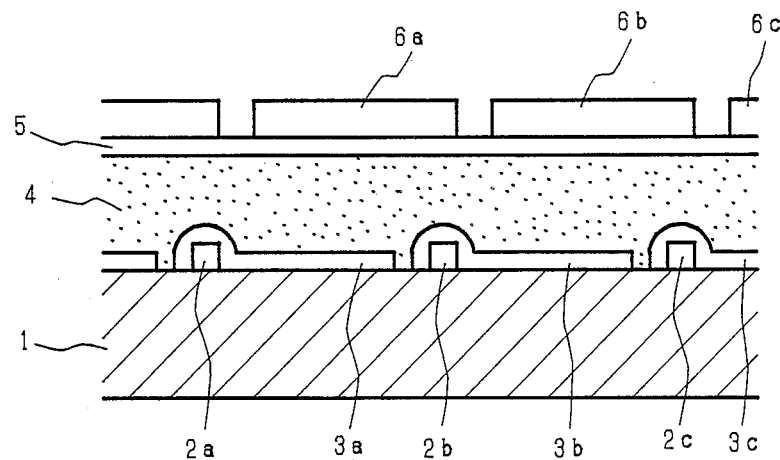

As shown in FIG. 11, indium-tin oxide flim is laminated all over the surface in a prescribed thickness (about 700 A) to form a light-permeable electrode 5, a material mainly comprising Ag paste is screen printed thereon formalamination of comb-like or lattice-like current collecting electrodes 6a, 6b, 6c, ... in every photoelectric power generating element A, B, C, ... formation area.

Figure 12:
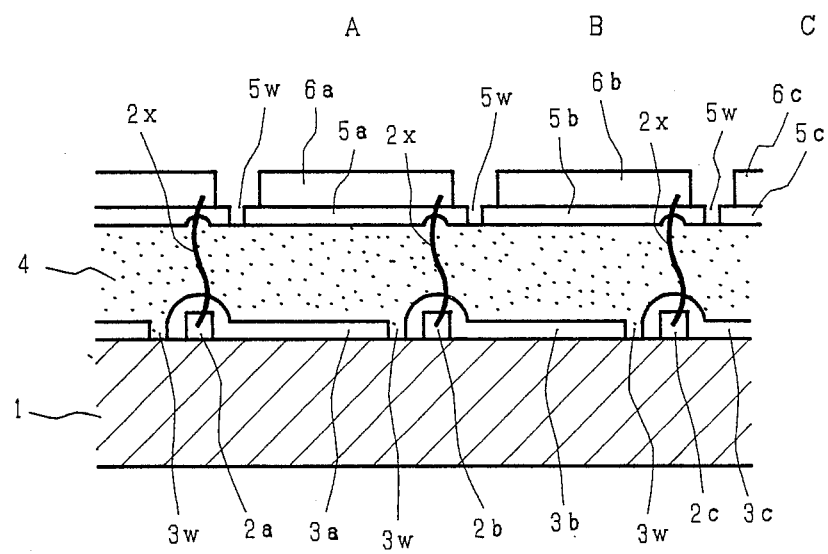
Figure 13:
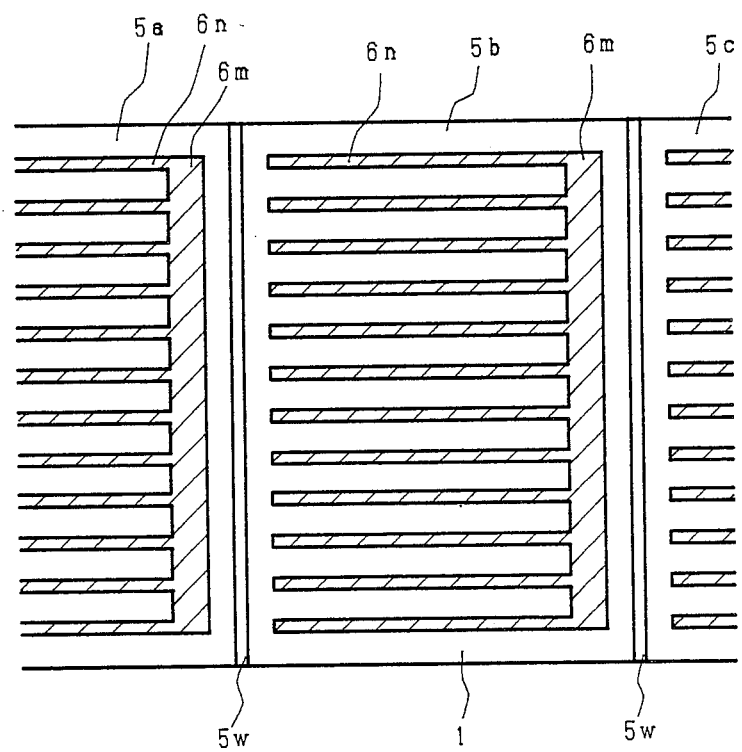
FIG. 13 is an enlarged plan view of FIG. 12.

FIG. 13 is a schematic plan view seen from the surface side of FIG. 12. The back sections 6m of the comb of the current collecting electrodes 6a, 6b, 6c, ... shown in FIG. 13 are positioned above the junction electrodes 2a, 2b, 2c, ... of other power generating elements adjacent to each other, correspondingly. The tooth section 6n extend from the back section 6m to the vicinity of the junction electrodes 2 of the photoelectric power generating elements A, B, C, .... The width of the tooth section 6n of the comb of the current collecting electrodes 6a, 6b, 6c, ... is about 0.05-0.15 mm, the width of the back section 6m is 0.2-0.5 mm, and the thickness is about 10-30 $\mu$m.

As shown in FIG. 12, a laser beam is irradiated on the light-permeable electrode 5 at a prescribed distance (0.1-0.2 mm) from the junction electrodes 2a, 2b, 2c, ... in a position diagonally opposite the grooves 3w dividing the back electrode 3 with respect to the junction electrodes 2a, 2b, 2c, ..., to provide grooves 5w reaching the semiconductive layer 4 from the surface of the light-permeable electrode 5 to divide the light-permeable electrode into light-permeable electrodes 5a, 5b, 5c, ... comprising the photoelectric power generating elements A, B, C, .... Then, to connect, for example, a junction electrode 2b comprising one element B of an adjacent photoelectric power generating elements and the current collecting electrode 6a of the other adjacent photoelectric popwer generating element A, the junction electrode 2b is irradiated with YAG laser beam of 1.06 $\mu$m in wave length from the insulative andd light-permeable substrate 1 side. This will melt the junction electrode 2b and, the same time, fuse the back electrode 3b located between the junction electrode 2b and the current collecting electrode 6a, semiconductive layer 4, light-permeable electrode 5a, and a part of the back of the current collecting electrode 6a. The groove formed by such fusing is filled with the melt of the junction electrode 2b, and the melt 2x is coagulated and electrically connects the back electrode 3b and the current collecting electrode 6a, resulting in the laser bonding.

In such a solar battery, the irradiation is incident through the spaces between the teeth 6n of the current collecting electrodes 6a, 6b, 6c, ... and light-permeable electrodes 5a, 5b, 5c, ... on the semiconductive layer 4, and the produced photovoltage is outputted through the back electrodes 3a, 3b, 3c, ... and the current collecting electrodes 6a, 6b, 6c, ....

The conversion efficiency of the thin-film solar battery thus produced was 7.3%.

The second embodiment naturally gives equivalent effects to the first embodiment.

In these 1 st and 2 nd embodiments, the semiconductive layer is described as being laminated in the order of n-type, i-type and p-type, but it is a matter of course that the semiconductive layer may be laminated in the reverse order of p-type, i-type and n-type, and may be laminated so as to provide a plurality of pin-type junctions.

The types of laser used in the laser scribe and laser bonding steps are not limited. For example, a $CO_2$ laser and other gas lasers may also be used.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A method of manufacturing a thin-film solar battery including a plurality of photoelectric power generating elements connected in series on an insulative and light-permeable substrate, comprising:
    a step of adjacently arranging a plurality of photoelectric power generating elements each including a junction electrode, a back electrode, a semiconductive layer, and a light-permeable electrode laminated in this order on said substrate, and
    a step of irradiating a laser beam from said substrate side onto the junction electrode of one of the photoelectric power generating elements and the light-permeable electrode of an adjacent photoelectric power generating element to melt said junction electrode and to connect the back electrode of said one photoelectric power generating element and the light-permeable electrode of said adjacent photoelectric power generating element with the coagulation of the melt.

2. A method of manufacturing a thin-film solar battery as claimed in claim 1, wherein the temperature of formation of said semiconductive layer is lower that the melting point of said junction electrode.

3. A method of manufacturing a thin-film solar battery as claimed in claim 1, wherein said lasers beam is a YAG laser beam.

4. A method of manufacturing a thin-film solar battery as claimed in claim 1, wherein said laser beam is a gas laser beam.

5. A method of manufacturing a thin-film solar battery as claimed in claim 4, wherein said gas laser beam is a $CO_2$ laser beam.

6. A method of manufacturing a thin-film solar batter as claimed in claim 1, wherein the conductivity types of said semiconductive layer are n-type, i-type and p-type in this order from said substrate side.

7. A method of manufacturing a thin-film solar battery as claimed in claim 1, wherein the conductivity types of said semiconductive layer are p-type, i-type and n-type in this order from said substrate side.

8. A method of manufacturing a thin-film solar battery as claimed in claim 1, wherein said semiconductive layer has two or more pin-type junctions.

9. A method of manufacturing a thin-film solar battery including a plurality of photoelectric power generating elements connected in series on an insulative and light-permeable substrate, comprising:

a step of adjacently arranging a plurality of photoelectric power generating elements each including a junction electrode, a back electrode, a semiconductive layer, a light-permeable electrode, and a current collecting electrode laminated in this order on said substrate, and a step of irradiating a laser beam from said substrate side onto the junction electrode of one of the photoelectric power generating elements and said current collecting electrode of an adjacent photoelectric power generating element, to melt said junction electrode and to connect the back electrode of said one photoelectric power generating element and the current collecting electrode of said adjacent photoelectric power generating element with the coagulation of the melt.

10. A method of manufacturing a thin-film solar battery as claimed in claim 9, wherein the temperature of formation of said semiconductive layer is lower than the melting point of said junction electrode.

11. A method of manufacturing a thin-film solar battery as claimed in claim 9, wherein said laser beam is a YAG laser beam.

12. A method of manufacturing a thin-film solar battery as claimed in claim 9, wherein said laser beam in a gas laser beam.

13. A method of manufacturing a thin-film solar battery as claimed in claim 12, wherein said gas beam is a $CO_2$ laser beam.

14. A method of manufacturing a thin-film solar battery as claimed in claim 9, wherein the conductivity types of said semiconductive layer are n-type, i-type and p-type in this order from the said substrate side.

15. A method of manufacturing a thin-film solar battery as claimed in claim 9, wherein the conductivity types of said semiconductive layer are p-type, i-type and n-type in this order from the substrate side.

16. A method of manufacturing a thin-film solar battery as claimed in claim 9, wherein said semiconductive layer has two or more pin-type junctions.

17. A thin-film solar battery including a plurality of photoelectric power generating elements connected in series and disposed on an insulative and light-permeable substrate, comprising, said plurality of photoelectric power generating elements each including a junction electrode, a back electrode, a semiconductive layer, and a light-permeable electrode, laminated in this order on said substrate, said series connection means having been formed bby irradiation a laser beam from said substrate side onto the junction electrode of one of the photoelectric power generating elements and the light-permeable electrode of an adjacent photoelectric power generating element, to melt said junction eletrode and to connect the back electrode of said one photoelectric power generating element and the light-permeable electrode of said adjacent photoelectric power generating element with the coagulation of the melt.

18. A thin-film solar battery as claimed in claim 17 wherein the temperature of formation of said semiconductive layer is lower than the melting point of said junction electrode.

19. A thin-film solar battery as claimed in claim 17, wherein said series connection means having been formed by irradiating comprises irradiating using a YAG laser beam source.

20. A thin-film solar battery as claimed in claim 17, wherein said series connection means having been formed by irradiating comprises irradiating using a gas laser beam source.

21. A thin-film solar battery as claimed in claim 20, wherein said gas laser beam is a $CO_2$ laser beam.

22. A thin-film solar battery as claimed in claim 17, wherein the conductivity types of said semiconductive layer are n-type, i-type and p-type in this order from said substrate side.

23. A thin-film solar battery as claimed in claim 17, wherein the conductivity types of said semiconductive layer are p-type, i-type and n-type in this order from said substrate side.

24. A thin-film solar battery as claimed in claim 17, wherein said semiconductive layer has two or more pin-type junctions.

25. A thin-film solar battery including a plurality of photoelectric power generating elements connected in series and disposed on an insulative and light-permeable substrate, comprising, said plurality of photoelectic, a back generting elements each including a junction electrode, a back electrode, a semiconductive layer, a light-permeable electrode and a current collecting electrode laminated in this order on said substrate, said series connection means having been formed by irradiating a laser beam from said substrate side onto the junction electrode of one of the photoelectric power generating elements and said current collecting electrode of an adjacent photelectric power generating element, to melt said junction electrode and to connect the back electrode of said one photoelectric power generating element and the current collecting electrode of said adjacent photoelectric power generating element with the coagulation of the melt.

26. A thin-film solar battery as claimed in claim 25 wherein the temperature of formation of said semiconductive layer is lower than the melting point of said junction electrode.

27. A thin-film solar battery as claimed in claim 25, wherein said series connection means having been formed by irradiating comprises irraddiating using a YAG laser beam source.

28. A thin-film solar battery as claimed in claim 25, wherein said series connection means having been formed by irradiating comprises irradiating using a gas laser beam source.

29. A thin-solar battery as claimed in claim 28, wherein said gas laser beam is a $CO_2$ laser beam.

30. A thin-film solar battery as claimed in claim 25, wherein the conductivity types of said semiconductive layer are n-type, i-type and p-type in this order from said substrate side.

31. A thin-film solar battery as claimed in claim 25, wherein the conductivity types of said semiconductive layer are p-type, i-type and n-type in this order from said substrate side.

32. A thin-film solar battery as claimed in claim 25, wherein said semiconductive layer has two or more pin-type junctions.

* * * * *